US012451331B2

(12) United States Patent
Wakabayashi et al.

(10) Patent No.: US 12,451,331 B2
(45) Date of Patent: Oct. 21, 2025

(54) SHOWERHEAD ASSEMBLY WITH RECURSIVE GAS CHANNELS

(71) Applicant: Applied Materials, Inc., Santa Clara, CA (US)

(72) Inventors: Reyn Tetsuro Wakabayashi, San Jose, CA (US); Carlaton Wong, Sunnyvale, CA (US); Timothy Joseph Franklin, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 224 days.

(21) Appl. No.: 17/028,587

(22) Filed: Sep. 22, 2020

(65) Prior Publication Data

US 2022/0093361 A1 Mar. 24, 2022

(51) Int. Cl.

*H01L 21/00* (2006.01)
*C23C 16/00* (2006.01)
*H01J 37/32* (2006.01)

(52) U.S. Cl.

CPC .... *H01J 37/3244* (2013.01); *H01J 37/32532* (2013.01); *H01J 2237/006* (2013.01)

(58) Field of Classification Search

None

See application file for complete search history.

(56) References Cited

U.S. PATENT DOCUMENTS 3,614,547 A 10/1971 May
6,364,949 B1 * 4/2002 Or ........................ C23C 16/4412 118/724
9,017,481 B1 * 4/2015 Pettinger ........... H01J 37/32449 118/724
10,373,810 B2 * 8/2019 Noorbakhsh ..... H01J 37/32082

(Continued)

FOREIGN PATENT DOCUMENTS

JP 2011071187 A 4/2011
JP 2019021713 A 2/2019

(Continued)

OTHER PUBLICATIONS

KR20110083832A, Lee et al., Plasma Processing Apparatus, Jul. 21, 2011 (Year: 2011).*

(Continued)

*Primary Examiner* — Parviz Hassanzadeh
*Assistant Examiner* — Michelle Crowell
(74) *Attorney, Agent, or Firm* — Moser Taboada

(57) ABSTRACT

Embodiments of showerheads are provided herein. In some embodiments, a showerhead assembly includes a chill plate having a plurality of recursive gas paths and one or more cooling channels disposed therein, wherein each of the plurality of recursive gas paths is fluidly coupled to a single gas inlet extending to a first side of the chill plate and a plurality of gas outlets extending to a second side of the chill plate; and a heater plate coupled to the chill plate, wherein the heater plate includes a plurality of first gas distribution holes extending from a top surface thereof to a plurality of (Continued)

plenums disposed within the heater plate, the plurality of first gas distribution holes corresponding with the plurality of gas outlets of the chill plate, and a plurality of second gas distribution holes extending from the plurality of plenums to a lower surface of the heater plate.

20 Claims, 5 Drawing Sheets

(56) References Cited

U.S. PATENT DOCUMENTS

| | | | | |
|---|---|---|---|---|
| 2001/0054381 | A1* | 12/2001 | Umotoy | C23C 16/45514 118/725 |
| 2003/0032301 | A1 | 2/2003 | Dhindsa et al. | |
| 2003/0047282 | A1 | 3/2003 | Sago et al. | |
| 2007/0022954 | A1* | 2/2007 | Iizuka | C23C 16/455 118/724 |
| 2009/0081878 | A1 | 3/2009 | Dhindsa | |
| 2009/0104351 | A1 | 4/2009 | Kakegawa | |
| 2009/0162261 | A1 | 6/2009 | Baera et al. | |
| 2010/0116788 | A1 | 5/2010 | Singh et al. | |
| 2011/0162800 | A1 | 7/2011 | Noorbakhsh et al. | |
| 2011/0180233 | A1 | 7/2011 | Bera et al. | |
| 2012/0247672 | A1* | 10/2012 | Kobayashi | H01J 37/3244 156/345.33 |
| 2012/0255635 | A1 | 10/2012 | Banda et al. | |
| 2012/0273135 | A1* | 11/2012 | Hida | H01J 37/32091 313/42 |
| 2013/0118405 | A1* | 5/2013 | Ho | C23C 16/45572 118/724 |
| 2013/0126486 | A1* | 5/2013 | Bise | H01J 37/32642 219/121.48 |
| 2013/0337654 | A1 | 12/2013 | Patrick et al. | |
| 2014/0083361 | A1 | 3/2014 | Rocha-Alvarez et al. | |
| 2015/0013769 | A1 | 1/2015 | Saunders et al. | |
| 2015/0129112 | A1* | 5/2015 | Saito | H01J 37/32522 156/89.12 |
| 2015/0170977 | A1 | 6/2015 | Singh | |
| 2016/0343600 | A1 | 11/2016 | Parkhe | |
| 2017/0069470 | A1* | 3/2017 | Murakami | H01J 37/32541 |
| 2017/0178868 | A1* | 6/2017 | Ha | H01J 37/32532 |
| 2017/0292402 | A1 | 10/2017 | Barron et al. | |
| 2017/0335456 | A1 | 11/2017 | Nguyen et al. | |
| 2017/0365443 | A1 | 12/2017 | Carducci et al. | |
| 2019/0040529 | A1 | 2/2019 | Verbaas et al. | |
| 2020/0234930 | A1* | 7/2020 | Tamamushi | H01J 37/3244 |
| 2021/0032752 | A1* | 2/2021 | Noorbakhsh | C23C 16/45565 |
| 2021/0159053 | A1* | 5/2021 | Tong | H01J 37/32449 |
| 2021/0238745 | A1 | 8/2021 | Franklin et al. | |
| 2021/0238746 | A1 | 8/2021 | Franklin et al. | |
| 2022/0093362 | A1 | 3/2022 | Behnke et al. | |

FOREIGN PATENT DOCUMENTS

| | | | | | |
|---|---|---|---|---|---|
| KR | 20110083832 | A | * | 7/2011 | C23C 16/4557 |
| KR | 10-2017-0073757 | A | | 6/2017 | |
| KR | 20190045714 | A | * | 5/2019 | B05B 15/555 |
| TW | 2016/05545 | A | | 2/2016 | |

OTHER PUBLICATIONS

KR20190045714A, Jang et al., Apparatus and Method for treating substrate, May 3, 2019 (Year: 2019).*

International Search Report for PCT/US2022/036413, dated Oct. 28, 2022.

International Search Report for PCT/US2021/051218, dated Jan. 10, 2022.

KR20130095119A, Wook et al., Atmospheric pressure plasma generating apparatus. Aug. 27, 2013, pp. 1-3, (Year: 2013).

* cited by examiner

SHOWERHEAD ASSEMBLY WITH RECURSIVE GAS CHANNELS

FIELD

Embodiments of the present disclosure generally relate to substrate processing equipment, and more specifically, showerheads for use with substrate processing equipment.

BACKGROUND

Conventional showerhead assemblies utilized in semiconductor process chambers (e.g., deposition chambers, etch chambers, or the like) typically include a single gas inlet that is fluidly coupled to a plurality of gas outlets to provide multiple gas injection points into a process volume. The multiple gas injection points provide more even flow distribution over a substrate being processed in the process chamber. The inventors have observed that using weldments to split the single gas inlet into the plurality of gas outlets may cause leaking and serviceability issues. In addition, using weldments to split the single gas inlet into the plurality of gas outlets may undesirably increase an overall thickness of the showerhead assembly.

Accordingly, the inventors have provided embodiments of improved showerhead assemblies.

SUMMARY

Embodiments of showerheads for use in a substrate processing chamber are provided herein. In some embodiments, a showerhead assembly for use in a substrate processing chamber includes: a chill plate having a plurality of recursive gas paths disposed therein that are fluidly independent from each other and one or more cooling channels disposed therein, wherein each of the plurality of recursive gas paths is fluidly coupled to a single gas inlet extending to a first side of the chill plate and a plurality of gas outlets extending to a second side of the chill plate; and a heater plate coupled to the chill plate, wherein the heater plate includes one or more heating elements disposed therein, a plurality of first gas distribution holes extending from a top surface thereof to a plurality of plenums that are fluidly independent disposed within the heater plate, the plurality of first gas distribution holes corresponding with the plurality of gas outlets of the chill plate, and a plurality of second gas distribution holes extending from the plurality of plenums to a lower surface of the heater plate.

In some embodiments, a showerhead assembly for use in a process chamber includes: a chill plate having one or more cooling channels disposed therein; a heater plate coupled to the chill plate, the heater plate having one or more heating elements embedded therein; and an upper electrode coupled to the heater plate, wherein the showerhead assembly includes a plurality of gas flow paths that are fluidly independent from each other, wherein each of the plurality of gas flow paths extend from a gas inlet on an upper surface of the chill plate to a recursive flow path within the chill plate to a plurality of outlets on a lower surface of the chill plate through a plurality of first gas distribution holes, a plurality of plenums, and a plurality of second gas distribution holes of the heater plate and through a plurality of third gas distribution holes of the upper electrode.

In some embodiments, a process chamber includes: a chamber body defining an interior volume therein; a substrate support disposed in the interior volume to support a substrate; and a showerhead assembly disposed in the interior volume opposite the substrate support, wherein the showerhead assembly comprises: a chill plate having a plurality of recursive gas paths disposed therein that are fluidly independent from each other and one or more cooling channels disposed therein, wherein each of the plurality of recursive gas paths is fluidly coupled to a single gas inlet extending to a first side of the chill plate and a plurality of gas outlets extending to a second side of the chill plate; a heater plate coupled to the chill plate, wherein the heater plate includes one or more heating elements embedded therein, a plurality of first gas distribution holes extending from a top surface thereof to a plurality of plenums that are fluidly independent disposed within the heater plate, the plurality of first gas distribution holes corresponding with the plurality of gas outlets of the chill plate, and a plurality of second gas distribution holes extending from the plurality of plenums to a lower surface of the heater plate; and an upper electrode coupled to the heater plate and having a plurality of third gas distribution holes, each of which are fluidly coupled to one of the plurality of second gas distribution holes of the heater plate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
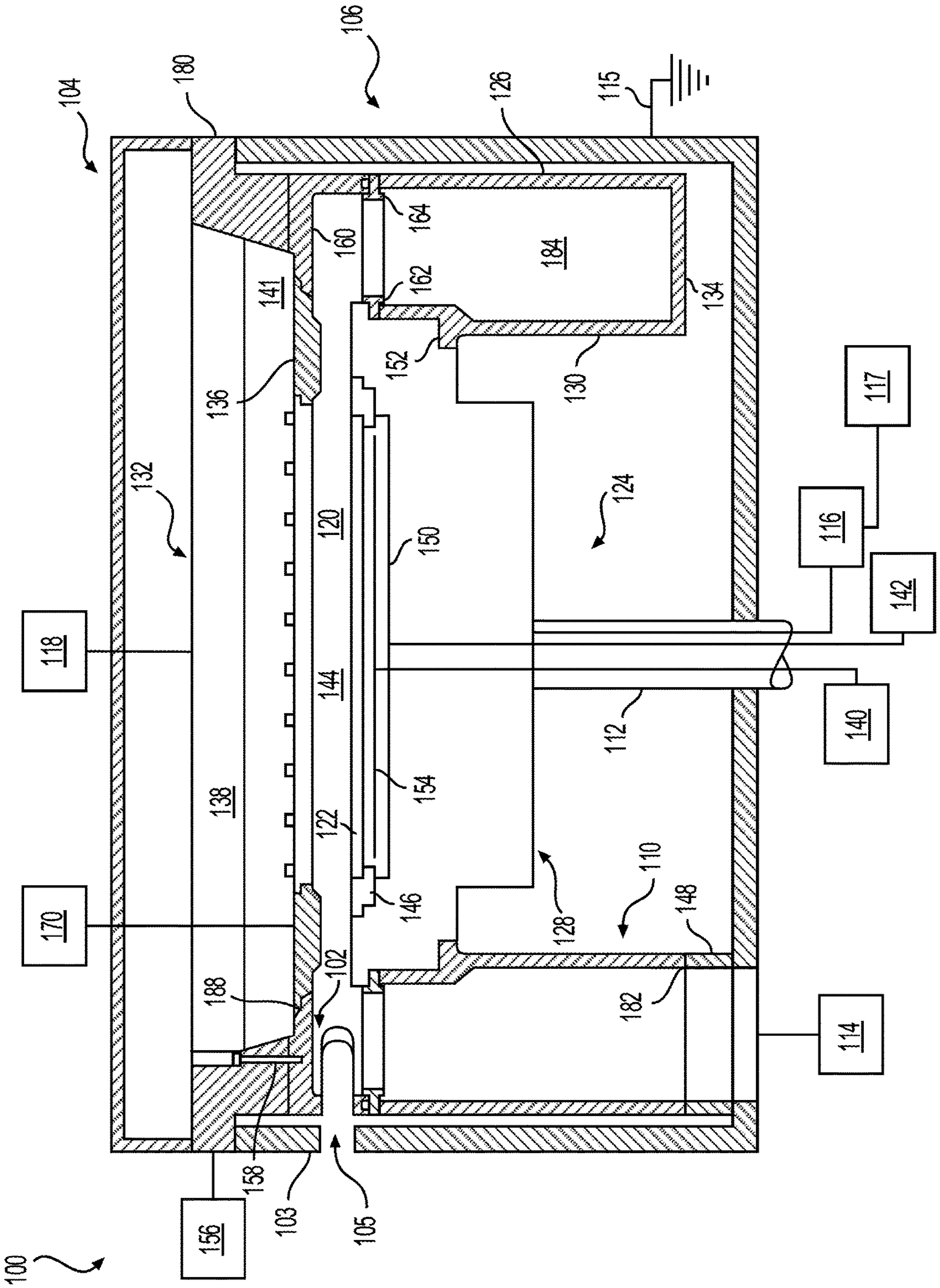
FIG. 1 depicts a schematic side view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of showerhead assemblies for use in a process chamber are provided herein. The showerhead assembly is configured to facilitate a flow of process gas to a substrate being processed within the processing chamber. In some embodiments, the showerhead assembly is configured to operate for high power applications. The showerhead assembly includes a heater plate configured to heat the showerhead assembly. The showerhead assembly includes a chill plate having cooling channels therethrough to cool the showerhead assembly. The showerhead assembly includes one or more recursive gas paths that extend from a single gas inlet to a plurality of gas outlets. In some embodiments, the one or more recursive gas paths are advantageously disposed in the chill plate to minimize a thickness of the showerhead assembly.

FIG. 1 depicts a schematic side view of a portion of a process chamber in accordance with some embodiments of the present disclosure. In some embodiments, the process chamber is an etch processing chamber. However, other types of processing chambers configured for different processes can also use or be modified for use with embodiments of the showerhead assemblies described herein.

The process chamber 100 is a vacuum chamber which is suitably adapted to maintain sub-atmospheric pressures within an interior volume 120 during substrate processing. The process chamber 100 includes a chamber body 106 having sidewalls and a bottom wall. The chamber body 106 is covered by a lid 104 and the chamber body 106 and the lid 104, together, define the interior volume 120. The chamber body 106 and lid 104 may be made of metal, such as aluminum. The chamber body 106 may be grounded via a coupling to ground 115.

A substrate support 124 is disposed within the interior volume 120 to support and retain a substrate 122, such as a semiconductor wafer, for example, or other such substrate as may be electrostatically retained. The substrate support 124 may generally comprise a pedestal 128 and a hollow support shaft 112 for supporting the pedestal 128. The pedestal 128 may include an electrostatic chuck 150. The electrostatic chuck 150 comprises a dielectric plate having one or more electrodes 154 disposed therein. The hollow support shaft 112 provides a conduit to provide, for example, backside gases, process gases, fluids, coolants, power, or the like, to the pedestal 128.

The substrate support 124 is coupled to a chucking power supply 140 and RF sources (e.g., RF bias power supply 117 or RF plasma power supply 170) to the electrostatic chuck 150. In some embodiments, a backside gas supply 142 is disposed outside of the chamber body 106 and supplies heat transfer gas to the electrostatic chuck 150. In some embodiments, the RF bias power supply 117 is coupled to the electrostatic chuck 150 via one or more RF match networks 116. In some embodiments, the substrate support 124 may alternatively include AC or DC bias power.

The process chamber 100 is also coupled to and in fluid communication with a gas supply 118 which may supply one or more process gases to the process chamber 100 for processing the substrate 122 disposed therein. A showerhead assembly 132 is disposed in the interior volume 120 opposite the substrate support 124. In some embodiments, the showerhead assembly 132 is coupled to the lid 104. The showerhead assembly 132 and the substrate support 124 partially define a processing volume 144 therebetween. The showerhead assembly 132 includes a plurality of openings to distribute the one or more process gases from the gas supply 118 into the processing volume 144. The showerhead assembly 132 includes a chill plate 138 to control a temperature of the showerhead assembly 132 and holes/channels (described in more detail below) to provide a gas flow path through the chill plate 138. The showerhead assembly 132 includes a heater plate 141 coupled to the chill plate 138. The heater plate 141 includes one or more heating elements disposed or embedded therein to control a temperature of the showerhead assembly 132 and include holes/channels (described in more detail below) to provide a gas flow path through the heater plate 141. In some embodiments, the showerhead assembly 132 includes an upper electrode 136 coupled to the heater plate 141. The upper electrode 136 is disposed in the interior volume 120 opposite the substrate support 124. The upper electrode 136 is coupled to one or more power sources (e.g., RF plasma power supply 170) to ignite the one or more process gases. In some embodiments, the upper electrode 136 comprises single crystal silicon or other silicon containing material.

A liner 102 is disposed in the interior volume 120 about at least one of the substrate support 124 and the showerhead assembly 132 to confine a plasma therein. In some embodiments, the liner 102 is made of a suitable process material, such as aluminum or a silicon-containing material. The liner 102 includes an upper liner 160 and a lower liner 162. The upper liner 160 may be made of any of the materials mentioned above. In some embodiments, the lower liner 162 is made of the same material as the upper liner 160. In some embodiments, the upper liner 160 includes a stepped inner surface that corresponds with a stepped outer surface 188 of the upper electrode 136.

The lower liner 162 includes a plurality of radial slots 164 arranged around the lower liner 162 to provide a flow path of the process gases to a pump port 148 (discussed below). In some embodiments, the liner 102, along with the showerhead assembly 132 and the pedestal 128, at least partially define the processing volume 144. In some embodiments, an outer diameter of the showerhead assembly 132 is less than an outer diameter of the liner 102 and greater than an inner diameter of the liner 102. The liner 102 includes an opening 105 corresponding with a slit 103 in the chamber body 106 for transferring the substrate 122 into and out of the process chamber 100.

In some embodiments, the liner 102 is coupled to a heater ring 180 to heat the liner 102 to a predetermined temperature. In some embodiments, the liner 102 is coupled to the heater ring 180 via one or more fasteners 158. A heater power source 156 is coupled to one or more heating elements in the heater ring 180 to heat the heater ring 180 and the liner 102.

The process chamber 100 is coupled to and in fluid communication with a vacuum system 114, which includes a throttle valve and a vacuum pump, used to exhaust the process chamber 100. The pressure inside the process chamber 100 may be regulated by adjusting the throttle valve and/or vacuum pump. The vacuum system 114 may be coupled to a pump port 148.

In some embodiments, the liner 102 rests on a lower tray 110. The lower tray 110 is configured to direct a flow of the one or more process gases and processing by-products from the plurality of radial slots 164 to the pump port 148. In some embodiments, the lower tray 110 includes an outer sidewall 126, an inner sidewall 130, and a lower wall 134 extending from the outer sidewall 126 to the inner sidewall 130. The outer sidewall 126, the inner sidewall 130, and the lower wall 134 define an exhaust volume 184 therebetween. In some embodiments, the outer sidewall 126 and the inner sidewall 130 are annular. The lower wall 134 includes one or more openings 182 (one shown in FIG. 1) to fluidly couple the exhaust volume 184 to the vacuum system 114. The lower tray 110 may rest on or be otherwise coupled to the pump port 148. In some embodiments, the lower tray 110 includes a ledge 152 extending radially inward from the inner sidewall 130 to accommodate a chamber component, for example, the pedestal 128 of the substrate support 124. In some embodiments, the lower tray 110 is made of a conductive material such as aluminum to provide a ground path.

In operation, for example, a plasma may be created in the processing volume 144 to perform one or more processes. The plasma may be created by coupling power from a plasma power source (e.g., RF plasma power supply 170) to a process gas via one or more electrodes (e.g., upper electrode 136) near or within the interior volume 120 to ignite the process gas and create the plasma. A bias power may also be provided from a bias power supply (e.g., RF bias power supply 117) to the one or more electrodes 154 within the electrostatic chuck 150 to attract ions from the plasma towards the substrate 122.

A plasma sheath can bend at an edge of the substrate 122 causing ions to accelerate perpendicularly to the plasma sheath. The ions can be focused or deflected at the substrate edge by the bend in the plasma sheath. In some embodiments, the substrate support 124 includes an edge ring 146 disposed about the electrostatic chuck 150. In some embodiments, the edge ring 146 and the electrostatic chuck 150 define a substrate receiving surface. The edge ring 146 may be coupled to a power source, such as RF bias power supply 117 or a second RF bias power supply (not shown) to control and/or reduce the bend of the plasma sheath.

Figure 2:
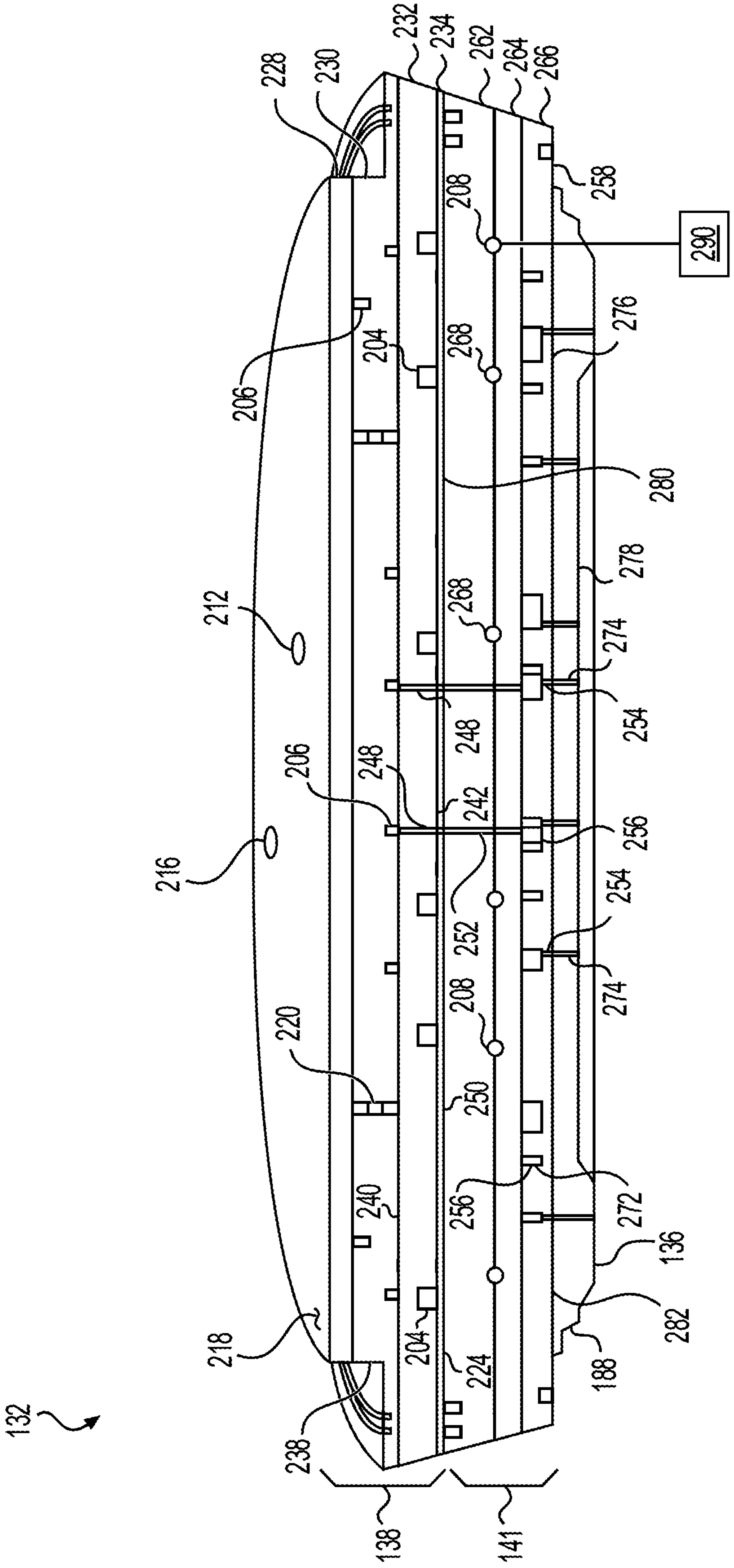
FIG. 2 depicts a cross-sectional view of a showerhead assembly in accordance with some embodiments of the present disclosure.

FIG. 2 depicts a cross-sectional view of a showerhead assembly 132 in accordance with some embodiments of the present disclosure. The showerhead assembly 132 includes the chill plate 138 having one or more cooling channels 204 disposed or embedded therein. The showerhead assembly 132 includes the heater plate 141 coupled to the chill plate 138. The heater plate 141 includes one or more heating elements 208 disposed or embedded therein. The one or more heating elements 208 may be arranged in one or more heating zones to provide independent temperature control to two or more gas zones of the showerhead assembly 132. The one or more heating elements 208 are coupled to one or more power supplies 290. The showerhead assembly 132 includes a plurality of gas flow paths that are fluidly independent from each other and extend through the showerhead assembly 132. In some embodiments, the chill plate 138 is made of aluminum. In some embodiments, the heater plate 141 is made of aluminum.

The chill plate 138 includes a plurality of recursive gas paths 206 disposed therein that are fluidly independent from each other and corresponding to the two or more gas zones of the showerhead assembly 132. For example, the plurality of recursive gas paths 206 may comprise two, three, or four recursive gas paths (two recursive gas paths depicted in FIGS. 3 and 4). Each of the plurality of recursive gas paths 206 is fluidly coupled to a single gas inlet extending to a first side 218 of the chill plate 138 and a plurality of gas outlets 248 extending to a second side 224 of the chill plate 138. Each of the recursive gas paths 206 may comprise a substantially equal flow path (i.e., substantially equal axial length and cross-sectional area) from the single gas inlet to each gas outlet of the plurality of gas outlets 248. In some embodiments, a substantially equal flow path may comprise lengths that are within 10% of each other. The substantially equal flow path advantageously provides more uniform gas distribution through the showerhead assembly 132 and into the processing volume 144.

In some embodiments, the plurality of recursive gas paths 206 are disposed about the chill plate 138 along a common plane (i.e., a single layer). In some embodiments, at least one of the plurality of recursive gas paths 206 are disposed about the chill plate 138 along two or more planes (i.e., two or more layers), where connecting channels (such as connecting channels 220) couple multiple layers of the plurality of recursive gas paths 206. The two or more layers advantageously allow for increased volume for the plurality of recursive gas paths 206 to extend within the chill plate 138 as compared to a single layer. FIG. 2 depicts at least one of the plurality of recursive gas paths 206 disposed along two planes.

In some embodiments, the chill plate 138 comprises one or more plates coupled together. As depicted in FIG. 2, in some embodiments, the chill plate 138 includes a gas plate 230 having a first side 238 coupled to a top plate 228 and a second side 240 coupled to a cooling plate 232. The cooling plate 232 is coupled to a bottom plate 234 on a side of the cooling plate 232 opposite the gas plate 230. In such embodiments, the one or more cooling channels 204 are disposed along a bottom surface 242 of the cooling plate 232. In some embodiments, the plurality of recursive gas paths 206 are disposed on at least one of the first side 238 and the second side 240 of the gas plate 230. In some embodiments, one or more of the plurality of recursive gas paths 206 are disposed on both the first side 238 and the second side 240 in embodiments where the plurality of recursive gas paths 206 are disposed in the chill plate 138 along two layers. In such embodiments, recursive gas paths that lie along two layers include connecting channels 220 that fluidly couple the two layers. In embodiments where the recursive gas paths 206 are disposed along more than two layers, the gas plate 230 may comprise two or more plates coupled together. The bottom plate 234 includes openings that at least partially define the plurality of gas outlets 248.

In some embodiments, a first gas inlet 212 extends from the first side 218 of the chill plate 138 (i.e., upper surface of top plate 228) to a first recursive gas path 310 (see FIG. 3) of the plurality of recursive gas paths 206. In some embodiments, a second gas inlet 216 extends from the first side 218 of the chill plate 138 to a second recursive gas path 330 (see FIG. 3) of the plurality of recursive gas paths 206.

In some embodiments, each of the plurality of recursive gas paths 206 are coupled to the gas supply 118. The gas supply can be configured to provide one or more process gases to any one or more of the recursive gas paths. For example, in some embodiments, the gas supply 118 is configured to provide a single process gas to each of the recursive gas paths 310, 330). In some embodiments, the gas supply 118 is configured to provide a first process gas or gaseous mixture to one or more of the recursive gas paths 310, 330 and a second process gas or gaseous mixture to a remainder of the recursive gas paths 310, 330. In some embodiments, the gas supply 118 is configured to provide different process gases or gaseous mixtures to each of the recursive gas paths.

The heater plate 141 includes one or more heating elements 208. In some embodiments, the heater plate 141 includes a plurality of first gas distribution holes 252 extending from a top surface 250 thereof to a plurality of plenums 256 that are fluidly independent and disposed in the heater plate 141. A plurality of second gas distribution holes 254 extend from the plurality of plenums 256 to a lower surface 258 of the heater plate to provide a gas flow path through the heater plate 141. In some embodiments, the plurality of second gas distribution holes 254 comprises more holes than the plurality of first gas distribution holes 252 to more uniformly disperse the one or more process gases into the processing volume 144.

The plurality of first gas distribution holes 252 are aligned with the plurality of gas outlets 248 of the chill plate 138. In some embodiments, the plurality of plenums 256 correspond with the plurality of recursive gas paths 206. In some embodiments, the showerhead assembly 132 includes the upper electrode 136 coupled to the heater plate 141. The upper electrode 136 includes a plurality of third gas distribution holes 274 extending from a top surface 276 thereof at locations corresponding to locations of the plurality of second gas distribution holes 254 of the heater plate 141 to a lower surface 278 of the upper electrode 136. In some embodiments, the plurality of third gas distribution holes 274 have a diameter of about 10 mils to about 50 mils. The upper electrode 136, the heater plate 141, and the chill plate 138 may be coupled together via fasteners, spring tensioners, or the like.

In some embodiments, each of the plurality of gas flow paths through the showerhead assembly 132 that are fluidly independent from each other extends through the chill plate 138 via a respectively gas inlet on the first side 218 of the chill plate 138 to a recursive flow path within the chill plate 138 to a respective plurality of gas outlets 248 that extend to the second side 224 of the chill plate 138, through the heater plate 141 via respective holes of the plurality of first gas distribution holes 252, a respective plenum of the plurality of plenums 256, and respective holes of the plurality of second gas distribution holes 254, and through the upper electrode 136 via the plurality of third gas distribution holes 274. For example, a first gas flow path extends from the plurality of gas outlets 248 associated with the first recursive gas path 410 through corresponding ones of the first gas distribution holes 252 and into a first plenum of the plurality of plenums 256. Similarly, a second gas flow path extends from the plurality of gas outlets 248 associated with the second recursive gas path 330, through corresponding ones of the first gas distribution holes 252 and into a second plenum of the plurality of plenums 256.

In some embodiments, the heater plate 141 comprises one or more plates coupled together. In some embodiments, the heater plate 141 includes a first plate 262 coupled to a second plate 264. The one or more heating elements 208 are disposed in a plurality of channels 268. In some embodiments, the plurality of channels 268 are disposed in the first plate 262. In some embodiments, the plurality of channels 268 are disposed in the second plate 264. In some embodiments, the plurality of channels 268 are defined by both the first plate 262 and the second plate 264. In some embodiments, the first plate 262 and the second plate 264 both include the plurality of channels 268. In some embodiments, a third plate 266 is coupled to the second plate 264 on a side of the second plate 264 opposite the first plate 262. In some embodiments, the third plate 266 includes a second plurality of channels 272 that define the plurality of plenums 256.

In some embodiments, a first thermal gasket sheet 280 is disposed between the chill plate 138 and the heater plate 141 to provide enhanced thermal coupling therebetween and a compression interface. In some embodiments, a second thermal gasket sheet 282 is disposed between the heater plate 141 and the upper electrode 136 to provide enhanced thermal coupling therebetween and a compression interface. The first thermal gasket sheet 280 includes a plurality of openings corresponding with locations of the plurality of first gas distribution holes 252 of the heater plate 141. The second thermal gasket sheet 282 includes a plurality of openings corresponding with locations of the plurality of second gas distribution holes 254 of the heater plate 141. The first thermal gasket sheet 280 and the second gasket sheet 281 are made of a thermally and electrically conductive sheet of material. In some embodiments, the first thermal gasket sheet 280 and the second gasket sheet 281 comprise a polymer material. In some embodiments, the first thermal gasket sheet 280 and the second gasket sheet 281 comprise an elastomer and metal sandwich structure.

Figure 3:
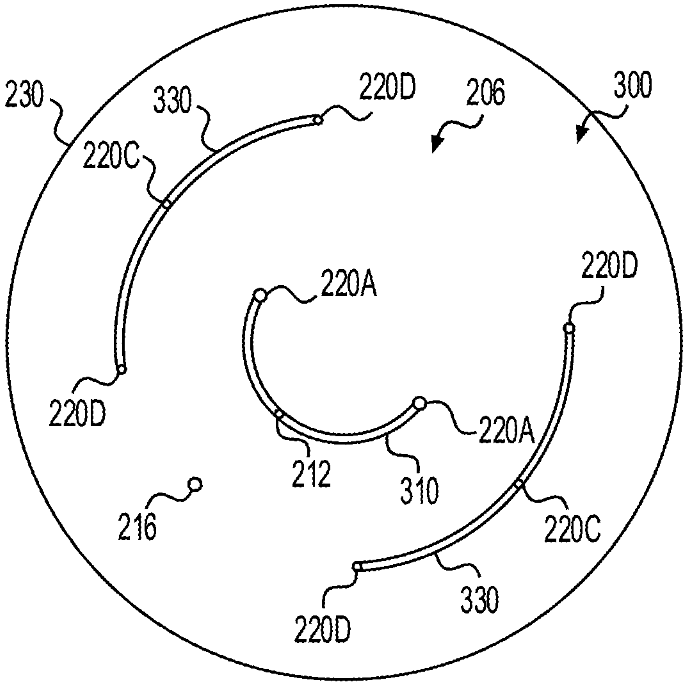
FIG. 3 depicts a top view of a gas plate of a showerhead assembly in accordance with some embodiments of the present disclosure.
Figure 4:
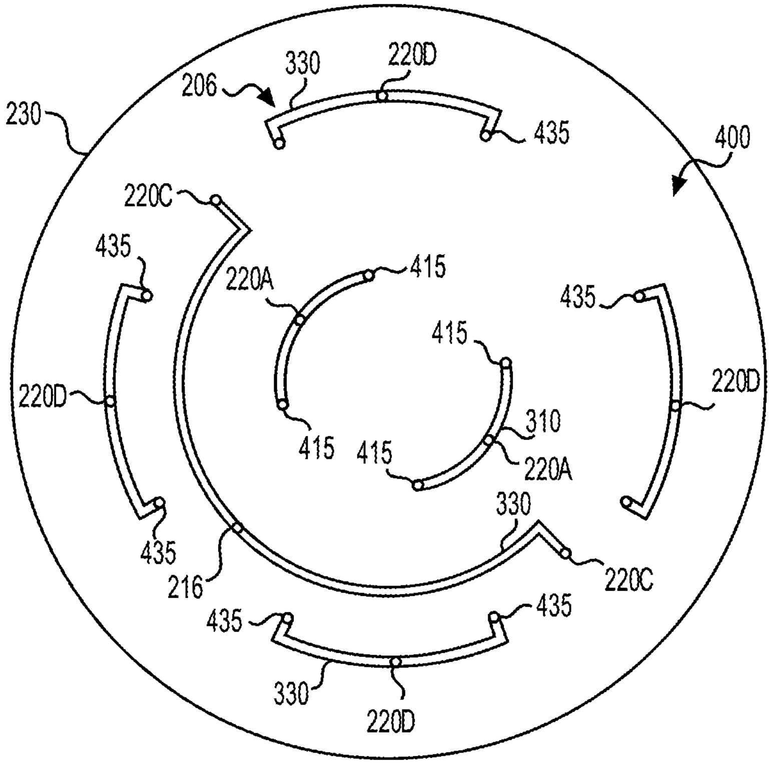
FIG. 4 depicts a bottom view of a gas plate of a showerhead assembly in accordance with some embodiments of the present disclosure.

FIG. 3 depicts a top view of the gas plate 230 of the chill plate 138 in accordance with some embodiments of the present disclosure. FIG. 4 depicts a bottom view of the gas plate 230 in accordance with some embodiments of the present disclosure. The gas plate 230 depicted in FIGS. 3 and 4 has the plurality of recursive gas paths 206 disposed along two layers of the gas plate 230. FIG. 3 depicts embodiments of a first layer 300 of the plurality of recursive gas paths 206. FIG. 4 depicts embodiments of a second layer 400 of the plurality of recursive gas paths 206.

Each of the plurality of recursive gas paths 206 may be disposed in at least one of the first layer 300 and the second layer 400. In some embodiments, one or more of the plurality of recursive gas paths 206 extend from the second layer 400 to the first layer 300 and back to the second layer 400. In some embodiments, the first gas inlet 212 extends to the first layer 300 and is fluidly coupled to a first recursive gas path 310 disposed in both the first layer 300 and the second layer 400. In some embodiments, the first recursive gas path 310 branches out from the first gas inlet 212 one or more times in the first layer 300 to a plurality of ends corresponding with connecting channels 220A that fluidly couple the multiple layers of the first recursive gas path 310. In some embodiments, the first recursive gas path 310 branches out one time to two ends corresponding with two connecting channels 220A.

In some embodiments, in the second layer 400, the first recursive gas path 310 branches out one or more times from each of the connecting channels 220A to a plurality of first ends 415. In some embodiments, the first recursive gas path 310 branches out once from each connecting channel 220A in the second layer 400 to form four first ends 415. In some embodiments, the plurality of first ends 415 are symmetrically disposed about the gas plate 230. In some embodiments, the plurality of first ends 415 lie at regular intervals along an imaginary circle. In some embodiments, the first recursive gas path 310 includes annular extending portions and radial extending portions in the second layer 400. The plurality of second ends 435 are aligned with a first subset 248A of the plurality of gas outlets 248 of the chill plate 138. In some embodiments, the first recursive gas path 310 branches out two times from each connecting channel 220A in the second layer 400 to form eight first ends 415.

In some embodiments, a second recursive gas path 330 extends from the second gas inlet 216 to the second layer 400, to the first layer 300, and then back to the second layer 400. As such, the second recursive gas path 330 may be disposed in both the first layer 300 and the second layer 400. In some embodiments, the second recursive gas path 330 branches out from the second gas inlet 216 one or more times in the second layer 400 to a plurality of ends corresponding with connecting channels 220C that fluidly couple the multiple layers of the second recursive gas path 330. In some embodiments, the second recursive gas path 330 branches out once to form two ends corresponding with two connecting channels 220C.

In some embodiments, in the first layer 300, the second recursive gas path 330 branches out one or more times from each of the connecting channels 220C to ends corresponding with connecting channels 220D. In some embodiments, the second recursive gas path 330 branches out one time from each of the connecting channels 220C to form four ends corresponding with four connecting channels 220D.

In some embodiments, in the second layer 400, the second recursive gas path 330 branches out one or more times from each of the connecting channels 220D to a plurality of second ends 435. In some embodiments, the second recursive gas path 330 branches out once from each connecting channel 220D in the second layer 400 to form a total of eight second ends 435. In some embodiments, the plurality of second ends 435 are symmetrically disposed about the gas plate 230. In some embodiments, the plurality of second ends 435 are disposed at regular intervals along an imaginary circle. In some embodiments, the second recursive gas path 330 includes annular extending portions and radial extending portions in the second layer 400. The plurality of second ends 435 are aligned with a second subset 248B of the plurality of gas outlets 248 of the chill plate 138. In some embodiments, the second recursive gas path 330 is disposed radially outward from the first recursive gas path 310. In some embodiments, the second recursive gas path 330 branches out twice from each connecting channel 220D in the second layer 400 to form sixteen second ends 435.

Figure 5:
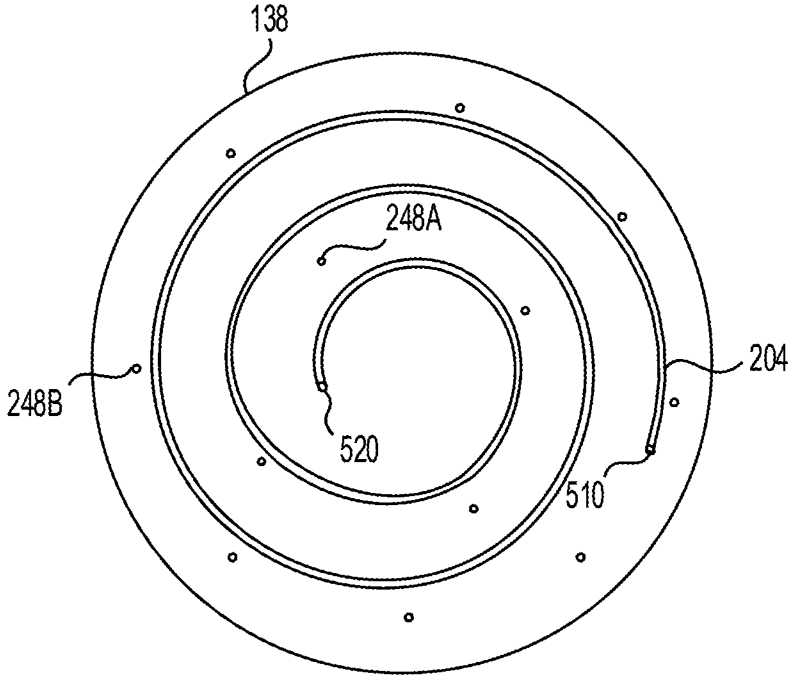
FIG. 5 depicts a cross-sectional bottom view of a chill plate of a showerhead assembly in accordance with some embodiments of the present disclosure.

FIG. 5 depicts a cross-sectional bottom view of a chill plate 138 of a showerhead assembly 132 in accordance with some embodiments of the present disclosure. In some embodiments, the plurality of gas outlets 248 are disposed along concentric circles of the chill plate 138. In some embodiments, the plurality of gas outlets 248 are disposed at regular intervals along concentric circles of the chill plate 138. In some embodiments, gas outlets of the plurality of gas outlets 248 at each concentric circle correspond with a different gas distribution zone of the showerhead assembly 132. In some embodiments, the showerhead assembly 132 comprises two gas distribution zones, wherein the first zone is a radially innermost zone and the second zone is the radially outermost zone. In some embodiments, the showerhead assembly 132 comprises four zones, where the first zone is a radially innermost zone, the second zone is radially outward of the first zone, the third zone is radially outward of the second zone, and the fourth zone is a radially outermost zone and is radially outward of the third zone.

In some embodiments, the one or more cooling channels 204 includes one cooling channel having an inlet 510 for supplying a coolant therethrough and an outlet 520 to provide a return path for the coolant. In some embodiments, the one or more cooling channels 204 extend proximate each zone. In some embodiments, the one or more cooling channels 204 are arranged in a spiral pattern.

Figure 6:
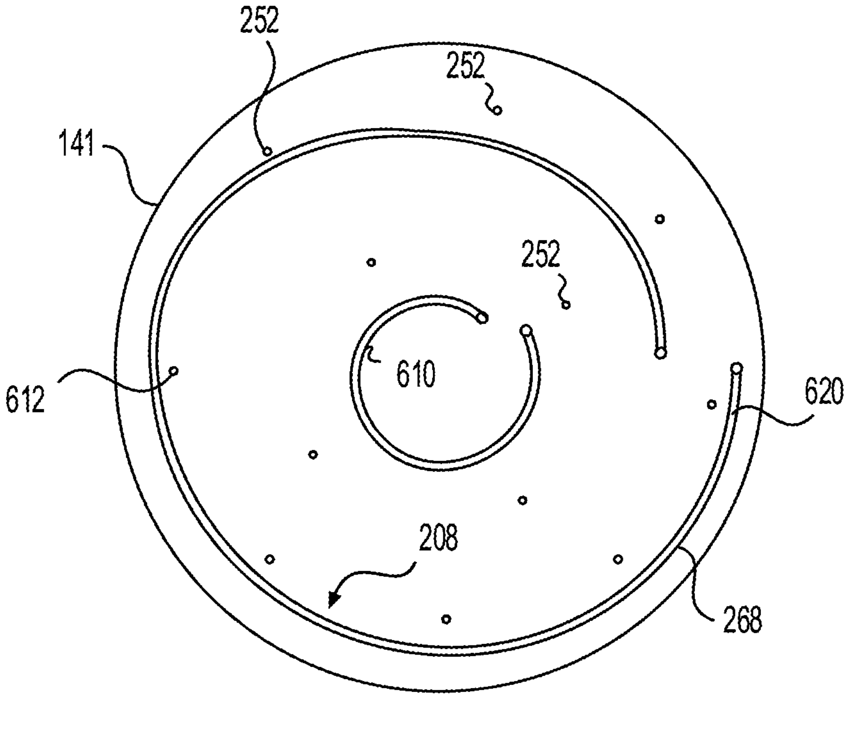
FIG. 6 depicts a cross-sectional top view of a heater plate of a showerhead assembly in accordance with some embodiments of the present disclosure.

FIG. 6 depicts a cross-sectional top view of a heater plate 141 of a showerhead assembly 132 in accordance with some embodiments of the present disclosure. The one or more heating elements 208 may extend about the heater plate 141 in any suitable pattern for heating the heater plate 141. In some embodiments, the one or more heating elements 208 are two or more heating elements defining two or more respective heating zones of the showerhead assembly 132. In some embodiments, the one or more heating elements 208 include a first heating element 610 proximate a center of the heater plate 141. In some embodiments, the one or more heating elements 208 include a second heating element 620 disposed radially outward of the first heating element 610. In some embodiments, the second heating element 620 extends radially outward beyond a radially outermost set 612 of the plurality of first gas distribution holes 252

Figure 7:
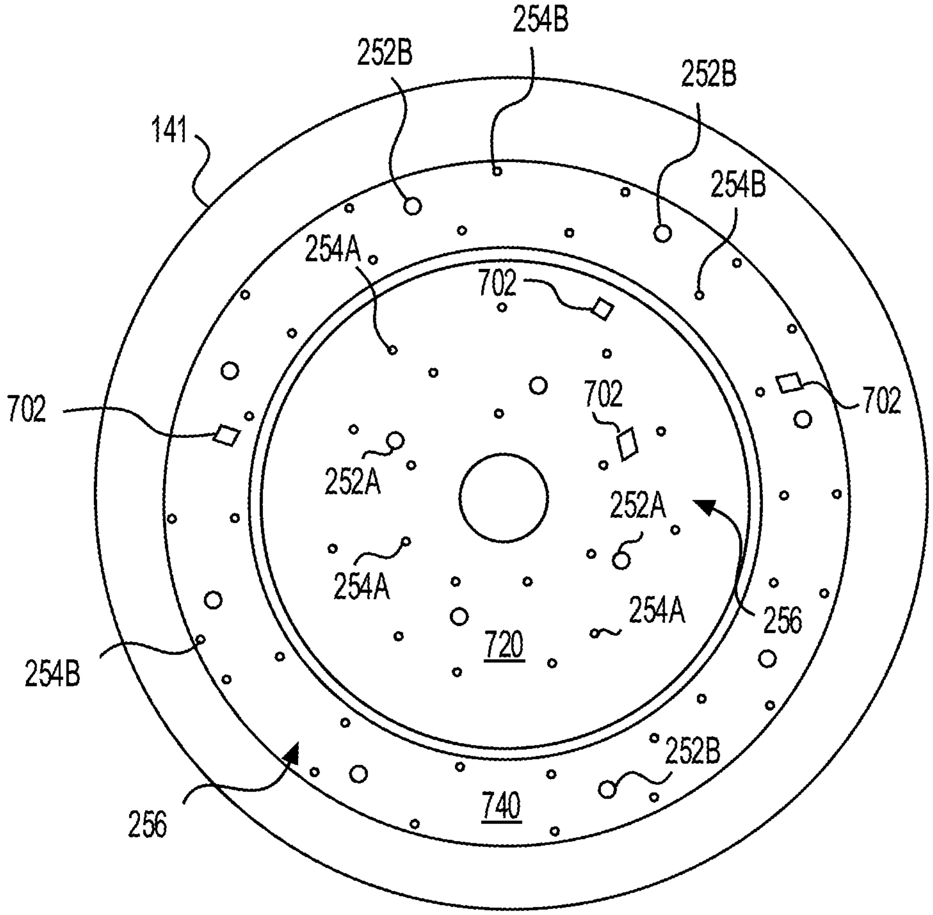
FIG. 7 depicts a cross-sectional top view of a heater plate of a showerhead assembly in accordance with some embodiments of the present disclosure.

FIG. 7 depicts a cross-sectional top view of the heater plate 141 along a plane of the plurality of plenums 256 in accordance with some embodiments of the present disclosure. In some embodiments, the plurality of plenums 256 correspond with a plurality of gas distribution zones. In some embodiments, the plurality of plenums 256 comprise two plenums corresponding with the two gas distribution zones. In some embodiments, the plurality of plenums 256 comprise four plenums corresponding with four gas distribution zones. In some embodiments, a first plenum 720 is fluidly coupled to a first subset 252A of the first gas distribution holes 252 that are associated with the first recursive gas path 310. In some embodiments, a second plenum 740 is fluidly coupled to a second subset 252B of the plurality of first gas distribution holes 252 that are associated with the second recursive gas path 330. The first plenum 720 is fluidly coupled with a first subset 254A of the plurality of second gas distribution holes 254. The second plenum 740 is fluidly coupled with a second subset 254B of the plurality of second gas distribution holes 254. The plurality of second gas distribution holes 254 are evenly distributed within each plenum. The first plenum 720 and the second plenum 740 may include a plurality of walls 702 to direct gas flow from the plurality of first gas distribution holes 252 to the plurality of second gas distribution holes 254 in each plenum. In some embodiments, the plurality of walls 702 have a polygonal cross-sectional shape. In some embodiments, the plurality of walls 702 are curved. In some embodiments, the plurality of second gas distribution holes 254 comprise more than 100 holes in the plurality of plenums 256. In some embodiments, the plurality of second gas distribution holes 254 are arranged in concentric circles. In some embodiments, the second gas distribution holes 254 within each concentric circle are disposed at regular intervals along the respective concentric circle. Each plenum of the plurality of plenums 256 can include one or more concentric circle of second gas distribution holes 254. In some embodiments, the plurality of second gas distribution holes 254 have a diameter of about 10 mils to about 50 mils.

While the foregoing is directed to embodiments of the present disclosure, other and further embodiments of the disclosure may be devised without departing from the basic scope thereof.

The invention claimed is:

1. A showerhead assembly for use in a substrate processing chamber, comprising:

a chill plate comprising a gas plate disposed atop a cooling plate, the gas plate having a plurality of recursive gas paths integrally formed and disposed therein, the recursive gas paths being fluidly independent from each other and from one or more cooling channels disposed in the cooling plate, wherein each of the plurality of recursive gas paths is fluidly coupled to a single gas inlet in a first side of the gas plate and a plurality of gas outlets in a second side of the gas plate, wherein each of the plurality of recursive gas paths comprises an arcuate path extending from a respective one of the single gas inlet to a plurality of ends, each end coupled to a respective one of the plurality of gas outlets; and a heater plate coupled to a bottom side of the chill plate, opposite the gas plate, wherein the heater plate includes one or more heating elements disposed therein, a plurality of first gas distribution holes extending from a top surface thereof to a plurality of plenums that are fluidly independent and disposed within the heater plate, the plurality of first gas distribution holes corresponding with the plurality of gas outlets of the gas plate, and a plurality of second gas distribution holes extending from the plurality of plenums to a lower surface of the heater plate.

2. The showerhead assembly of claim 1, further comprising:

an upper electrode coupled to the heater plate and having a plurality of third gas distribution holes extending from a top surface thereof at locations corresponding to locations of the plurality of second gas distribution holes of the heater plate to a lower surface of the upper electrode; and a first thermal gasket sheet disposed between the chill plate and the heater plate and a second thermal gasket sheet disposed between the heater plate and the upper electrode.

3. The showerhead assembly of claim 1, wherein the gas plate has an upper portion and a lower portion, wherein the upper portion has an outer diameter less than an outer diameter of the lower portion, and wherein an outer diameter of the heater plate is greater than the outer diameter of the upper portion of the gas plate.

4. The showerhead assembly of claim 1, wherein the plurality of recursive gas paths are disposed along two layers within the gas plate at different horizontal planes, wherein one or more of the plurality of recursive gas paths are disposed on both the first side and the second side of the gas plate.

5. The showerhead assembly of claim 1, wherein the chill plate includes a bottom plate coupled to the cooling plate on a side opposite the gas plate, wherein the bottom plate is configured to cover and enclose the one or more cooling channels and includes openings aligned with the plurality of gas outlets of the gas plate.

6. The showerhead assembly of claim 1, wherein an outermost surface of the showerhead assembly tapers gradually radially inward from the gas plate to a bottom of the heater plate.

7. The showerhead assembly of claim 1, wherein the one or more heating elements of the heater plate define two or more heating zones of the showerhead assembly.

8. The showerhead assembly of claim 1, wherein the heater plate includes a first plate having a plurality of channels to accommodate the one or more heating elements, a second plate coupled to the first plate to cover the plurality of channels, and a third plate coupled to the second plate on a side opposite the first plate, the third plate having a second plurality of channels that define the plurality of plenums.

9. The showerhead assembly of claim 1, wherein the plurality of recursive gas paths include four recursive gas paths and the plurality of plenums includes four plenums to define four gas distribution zones at a lower surface of the showerhead assembly.

10. A showerhead assembly for use in a process chamber, comprising:

a chill plate having a gas plate coupled to a cooling plate and a bottom plate coupled to the cooling plate, wherein the cooling plate includes one or more cooling channels disposed along a lower surface of the cooling plate and the bottom plate is configured to at least partially define the one or more cooling channels a heater plate coupled to the chill plate, the heater plate having one or more heating elements embedded therein, wherein the heater plate includes a first plate adjacent the chill plate, a second plate coupled to the first plate, and a third plate coupled to the second plate, wherein the one or more heating elements are disposed at least partially in the first plate, wherein the first plate has an outermost diameter greater than an outermost diameter of the second plate and the third plate, and wherein the third plate includes a plurality of plenums; and an upper electrode coupled to the heater plate, wherein the showerhead assembly includes a plurality of gas flow paths that are fluidly independent from each other, wherein each of the plurality of gas flow paths extend from a gas inlet on an upper surface of the chill plate to a recursive flow path disposed in the gas plate of the chill plate to a plurality of outlets on a lower surface of the chill plate through a plurality of first gas distribution holes, the plurality of plenums, and a plurality of second gas distribution holes of the heater plate and through a plurality of third gas distribution holes of the upper electrode, and wherein the plurality of second gas distribution holes comprise more holes than the plurality of first gas distribution holes.

11. The showerhead assembly of claim 10, further comprising a first thermal gasket sheet disposed between the chill plate and the heater plate, wherein the first thermal gasket sheet includes a plurality of openings corresponding with locations of the plurality of first gas distribution holes of the heater plate.

12. The showerhead assembly of claim 10, wherein the one or more cooling channels are disposed below the recursive flow path.

13. The showerhead assembly of claim 10, wherein the chill plate and the heater plate are made of aluminum and the upper electrode is made of silicon.

14. The showerhead assembly of claim 10, wherein the plurality of plenums comprise a predominantly open volume, wherein a plurality of discrete walls are disposed in the plurality of plenums to direct gas flow from the plurality of first gas distribution holes to the plurality of second gas distribution holes.

15. The showerhead assembly of claim 10, wherein the plurality of third gas distribution holes of the upper electrode have a diameter of about 10 mils to about 50 mils.

16. A process chamber, comprising:

a chamber body defining an interior volume therein; and a substrate support disposed in the interior volume to support a substrate; and a showerhead assembly disposed in the interior volume opposite the substrate support, wherein the showerhead assembly comprises:

a chill plate having a plurality of recursive gas paths disposed therein that are fluidly independent from each other and one or more cooling channels disposed therein, wherein each of the plurality of recursive gas paths is fluidly coupled to a single gas inlet extending to a first side of the chill plate and a plurality of gas outlets extending to a second side of the chill plate, wherein at least one of the plurality of recursive gas paths are disposed along two or more layers at different horizontal planes, and wherein one or more of the plurality of recursive gas paths are disposed in a gas plate and on both a first side and a second side of the gas plate;

a heater plate coupled to the second side of the chill plate, wherein the heater plate includes one or more heating elements embedded therein, a plurality of first gas distribution holes extending from a top surface thereof to a plurality of plenums that are fluidly independent disposed within the heater plate, the plurality of first gas distribution holes corresponding with the plurality of gas outlets of the chill plate, and a plurality of second gas distribution holes extending from the plurality of plenums to a lower surface of the heater plate, wherein multiple ones of the plurality of first gas distribution holes extend into each plenum; and an upper electrode coupled to the heater plate and having a plurality of third gas distribution holes, each of which are fluidly coupled to one of the plurality of second gas distribution holes of the heater plate.

17. The process chamber of claim 16, wherein the plurality of recursive gas paths are two or four recursive gas paths.

18. The process chamber of claim 16, wherein at least one of the plurality of recursive gas paths extends from a second layer to a first layer and then back to the second layer.

19. The process chamber of claim 16, wherein the upper electrode includes a stepped outer surface that corresponds with a stepped inner surface of a liner disposed in the interior volume.

20. The process chamber of claim 16, further comprising a first thermal gasket sheet disposed between the heater plate and the chill plate.

* * * * *